United States Patent
Furukawa et al.

(10) Patent No.: US 7,030,539 B2
(45) Date of Patent: Apr. 18, 2006

(54) SURFACE ACOUSTIC WAVE DEVICE AND ELECTRONIC COMPONENT COMPRISING IT

(75) Inventors: Mitsuhiro Furukawa, Hyogo (JP); Kiyoharu Yamashita, Osaka (JP); Kazushi Nishida, Osaka (JP); Hiroshi Kurotake, Kyoto (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 156 days.

(21) Appl. No.: 10/432,499

(22) PCT Filed: Sep. 26, 2002

(86) PCT No.: PCT/JP02/09924

§ 371 (c)(1),
(2), (4) Date: Sep. 22, 2003

(87) PCT Pub. No.: WO03/032485

PCT Pub. Date: Apr. 17, 2003

(65) Prior Publication Data
US 2004/0046482 A1    Mar. 11, 2004

(30) Foreign Application Priority Data
Oct. 3, 2001    (JP)    ............... 2001-307272

(51) Int. Cl.
*H03H 9/25*    (2006.01)
*H01L 41/04*    (2006.01)

(52) U.S. Cl. ............... 310/313 D; 310/313 A; 310/313 B; 310/313 C; 310/313 R; 333/195; 333/196

(58) Field of Classification Search ........... 310/313 D; 333/195–196
See application file for complete search history.

(56) References Cited

U.S. PATENT DOCUMENTS 5,936,487 A * 8/1999 Solal et al. ................ 333/193
6,369,490 B1    4/2002 Taga ...................... 310/313 R

FOREIGN PATENT DOCUMENTS

| CN | 1271999 A | 11/2000 |
| JP | 07-263994 | 10/1995 |
| JP | 08-1954641 | 7/1996 |
| JP | 09-186543 | 7/1997 |
| JP | 09-069748 | 8/1997 |

OTHER PUBLICATIONS

Japanese International Search Report for PCT/JP02/09924, dated Dec. 3, 2002.
English translation of Japanese International Search Report for PCT/JP02/09924, dated Dec. 3, 2002.

* cited by examiner

*Primary Examiner*—Darren Schuberg
*Assistant Examiner*—J. Aguirrechea
(74) *Attorney, Agent, or Firm*—RatnerPrestia

(57) ABSTRACT

In a surface acoustic wave device, a common portion and a strip portion of a reflector electrode are partially cut off to increase a space between the electrodes. The increase of the space between the electrodes reduces the influence of the amount of charges and the influence of an unbalance between the amounts of charges in etching of a metallic film, thereby preventing the electrodes from having a curved shape in section. Consequently, the surface acoustic wave device has a reduced propagation loss.

21 Claims, 7 Drawing Sheets

SURFACE ACOUSTIC WAVE DEVICE AND ELECTRONIC COMPONENT COMPRISING IT

This Application is a U.S. National Phase Application of PCT International Application PCTIJP02/09924.

TECHNICAL FIELD

The present invention relates to a surface acoustic wave device and an electronic unit including the surface acoustic wave device and used in a communication apparatus or the like.

BACKGROUND ART

A conventional method for reducing loss of a surface acoustic wave (SAW) device is known in which electrode groups each consisting of an interdigital electrode and a common portion are spaced by n±¼ of a wavelength (where n is an arbitrary integer), and a phase shifter is connected to allow a surface acoustic wave to propagate in a single direction for reducing a conversion loss.

This method can effectively reduce the conversion loss by preventing bi-directional excitation of the surface acoustic wave, but increases a loss as a result of the bidirectional wave propagation at some portions since interdigitating portions functioning as excitation sources of the interdigital electrodes are not necessarily arranged on the same propagation path.

To solve this problem, a space between a finger of the interdigital electrode and the common portion adjacent to the finger is determined within ⅛ of the wavelength, and the finger of the interdigital electrode is provided with a branch. Alternatively, a corner of a common portion of the interdigital electrode or a reflector electrode is cut off.

These inventions are disclosed in Japanese Patent Laid-Open Publication Nos.07-263994 and 09-186543.

FIGS. 6A and 6B are a plan view and an enlarged partial view of a conventional SAW device, respectively. The device includes piezoelectric substrate 1, interdigital electrodes 2, reflector electrodes 3, common portion 4 of each interdigital electrode 2, and common portions 5 of each reflector electrode 3. In the conventional interdigital electrodes, interdigitating portions are formed on the same propagation path to allow a surface acoustic wave to propagate in a single direction, thus reducing the conversion loss resulting from different propagating directions. However, if a potential difference between the electrodes adjacent to each other increases during the forming of the electrodes, the resulting electrode has a curved shape in section, which causes energy of the surface acoustic wave to leak out. This leakage increases propagation loss. Although the electrodes having respective corners of the common portions cut off can be prevented from a short circuit between the electrodes, the finger still has the curved shape in section, and therefore, the energy of the surface acoustic wave leaks out, thus increasing the propagation loss increases.

SUMMARY OF THE INVENTION

A surface acoustic wave device includes a piezoelectric substrate, an interdigital electrode provided on the piezoelectric substrate, and a reflector electrode provided on the piezoelectric substrate. The reflector electrode includes a common portion and a strip portion. The common portion and the strip portion of the reflector electrode have respective cut portions adjacent to the interdigital electrode formed therein.

The SAW device and an electronic unit including the device thus have small propagation loss.

DETAILED DESCRIPTION OF THE PREFERRED EMBODIMENTS

Exemplary Embodiment 1

Figure 1A:
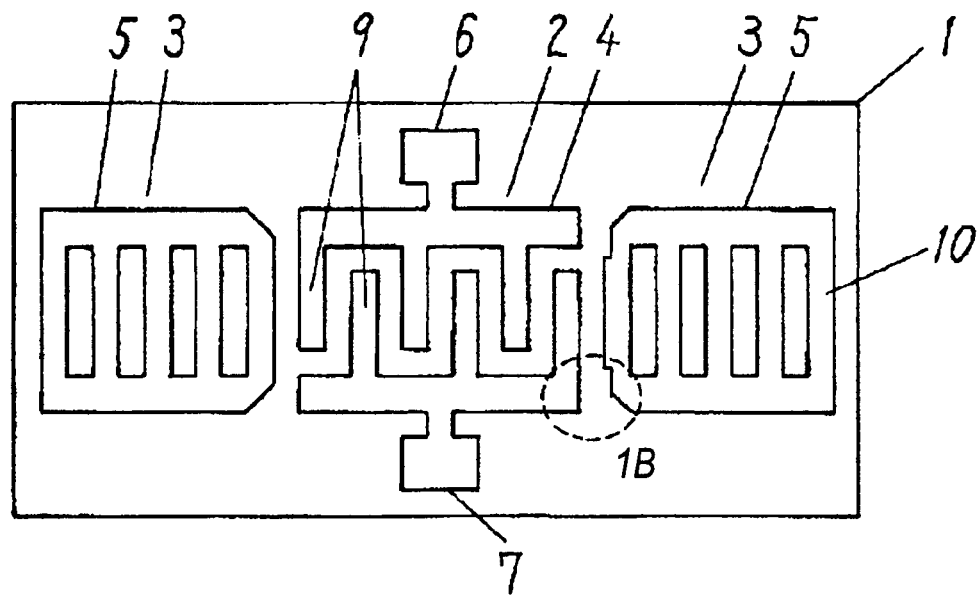
FIG. 1A is a plan view of a surface acoustic wave (SAW) device in accordance with exemplary embodiment 1 of the present invention.
Figure 1B:
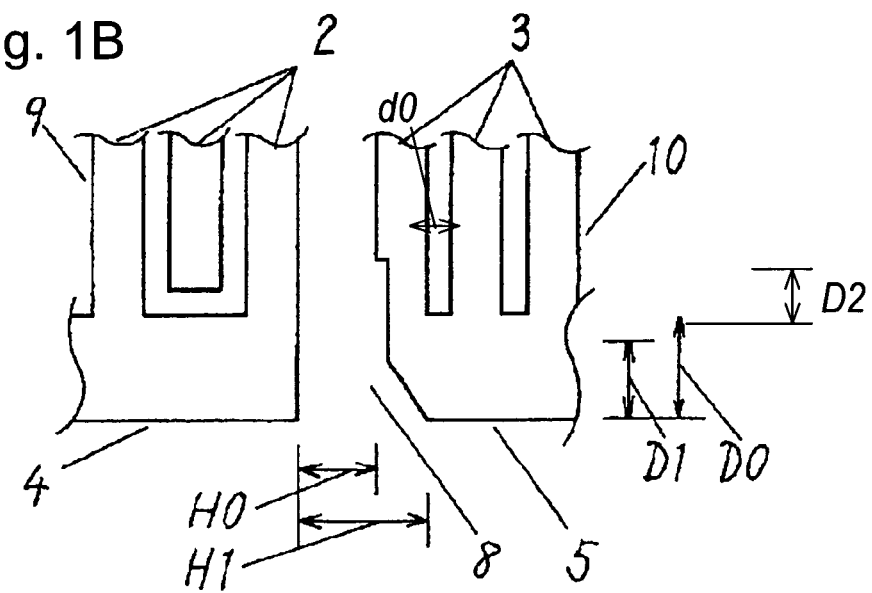
FIG. 1B is an enlarged partial view of the SAW device in accordance with embodiment 1.

FIG. 1A is a plan view of a surface acoustic wave (SAW) device in accordance with exemplary embodiment 1 of the present invention, and FIG. 1B is an enlarged view of region 1B of the SAW device in FIG. 1A. The SAW device includes piezoelectric substrate 1, interdigital electrode 2, reflector electrodes 3, common portions 4 of interdigital electrode 2, common portions 5 of each reflector electrode 3, input terminal electrode 6 and output terminal electrode 7. The reflector electrodes have cut portions 8 formed therein, respectively.

In FIG. 1B, a space HO is provided between interdigital electrode 2 and reflector electrode 3 before the electrode 3 is cut, and a maximum space H1 between interdigital electrode 2 and reflector electrode 3 after the electrode 3 is cut. The common portion has width D0 in a longitudinal direction of a strip portion before the electrode 3 is cut, and the common portion is cut by maximum cut width D1. The strip portion is cut by maximum cut width D2 measured from an end of the strip portion along its longitudinal direction and width d0 before the electrode 3 is cut.

FIG. 1A schematically illustrates the SAW device of embodiment 1, thus not actually showing a relative relation between respective lengths of the electrodes and a relative relation between the electrode-to-electrode spaces.

According to the embodiment, each common portion 5 of reflector electrode 3 has a portion cut off linearly at a corner facing interdigital electrode 2, and each reflector electrode 3 has portions cut off linearly at its outermost strip portion 10 adjacent to interdigital electrode 2. Thus, a space between interdigital electrode 2 and reflector electrode 3 partially increases. This arrangement prevents the electrode from having a curved shape in section generated by an influence of respective potentials of the electrodes adjacent to each other when a metallic film is etched to form a pattern of the electrode, thereby allowing the SAW device to have a reduced propagation loss.

A method of manufacturing the device in accordance with the present embodiment will be described.

A film of metal, such as Ti, having a 10 nm thickness is formed on piezoelectric substrate 1 shaped in wafer of LiTaO3 by sputtering or the like.

Next, a film of metal, such as Al, having a 100 nm thickness is formed on the Ti film by sputtering or the like.

The above process is repeated twice to stack the Ti and Al films, and provides metal film 22 including the Al film at its topmost layer. The metal film 22 has a 220 nm thickness. The order of the stacking of the Al and Ti films and the thickness of metallic film 22 may be modified according to requirement.

Next, resist 21 is applied on metal film 22, is exposed through a specified photo-mask by, for example, a stepper, and have unnecessary portions developed away to leave a specified pattern.

Subsequently, metal film 22 is, for example, dry-etched to form the pattern shown in FIG. 1A. Thereafter, the remaining resist is removed, and the wafer having the pattern formed thereon is cut into discrete SAW devices 12 by a dicer or the like. This method reduces an influence of the potential and heat generated during the etching of at the piezoelectric substrate and hence reduce variations in curved shapes in section of the electrodes on the piezoelectric substrate wafer. Consequently, plural SAW devices obtained from one wafer have reduced variations in propagation losses.

As shown in the pattern of FIG. 1A, each common portion 5 of reflector electrode 3 adjacent to interdigital electrode 2 has a portion partially cut, so that each of four common portions 5 has a cut corner facing the interdigital electrode. Each of the electrodes has a thickness of 220 nm, and ratio S/L of electrode-to-electrode space S to thickness L of the electrode is 2.7.

Electrode-to-electrode space S corresponds to a space between interdigital electrode 2 and reflector electrode 3 adjacent to the electrode 2 before the electrode is cut. Each of the cut portions satisfies the following conditions:

$H1/H0=1.7;$ $D1/D0=0.75;$ and $D2/d0=1.5.$

With the conditions being satisfied, the electrode does not have the curved shape in section.

Figure 2A:
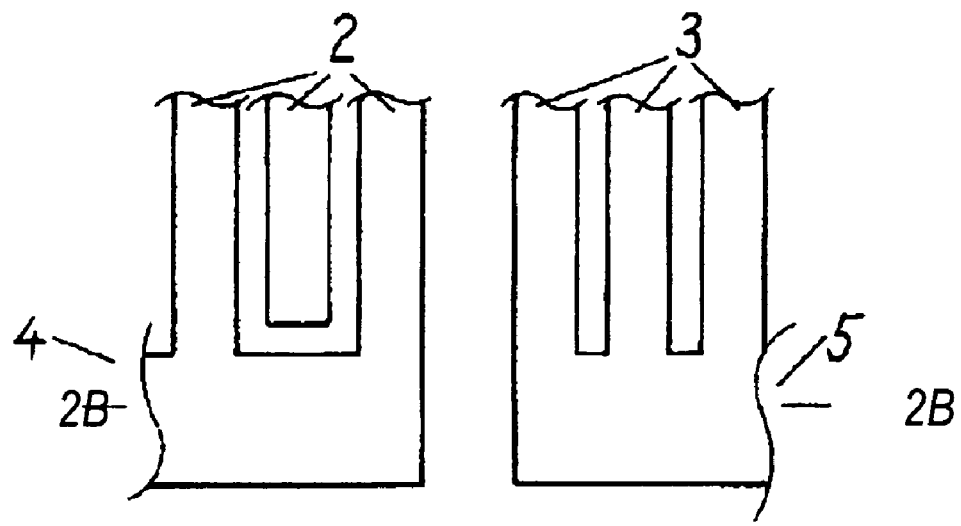
FIG. 2A is an enlarged partial view of a conventional SAW device.
Figure 2B:
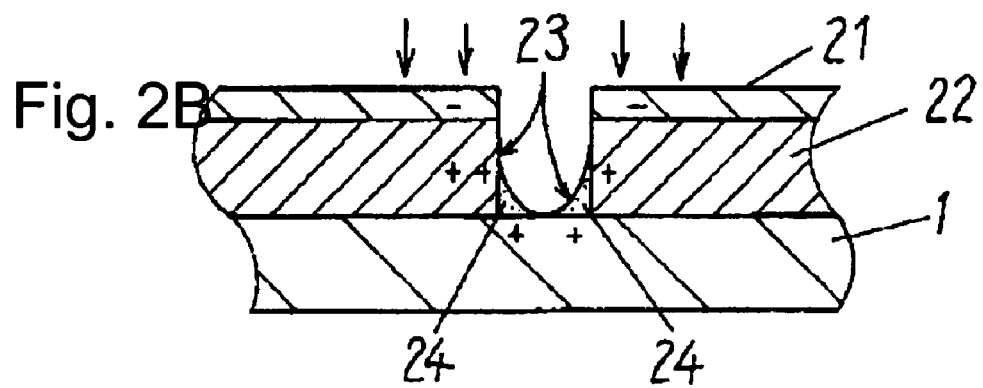
FIG. 2B is a sectional view of the device at a line 2B—2B in FIG. 2A.
Figure 2C:
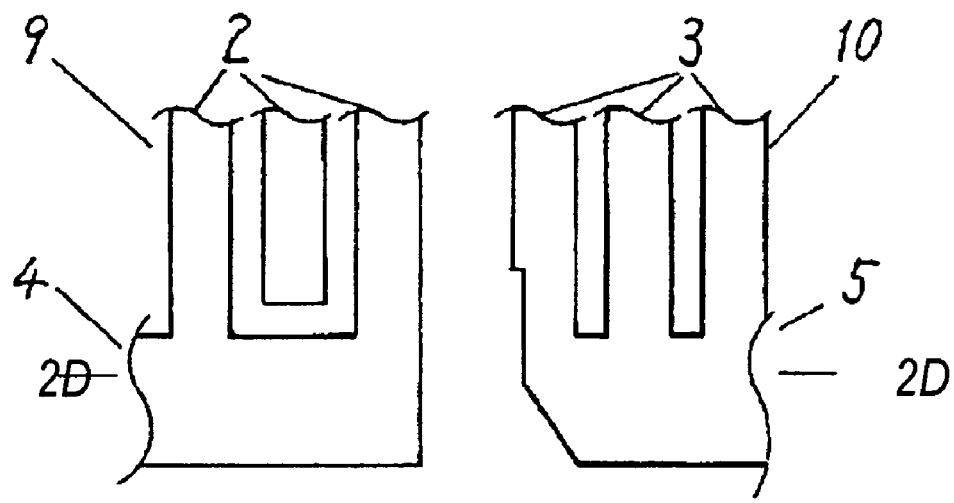
FIG. 2C is an enlarged partial view of the SAW device in accordance with embodiment 1.
Figure 2D:
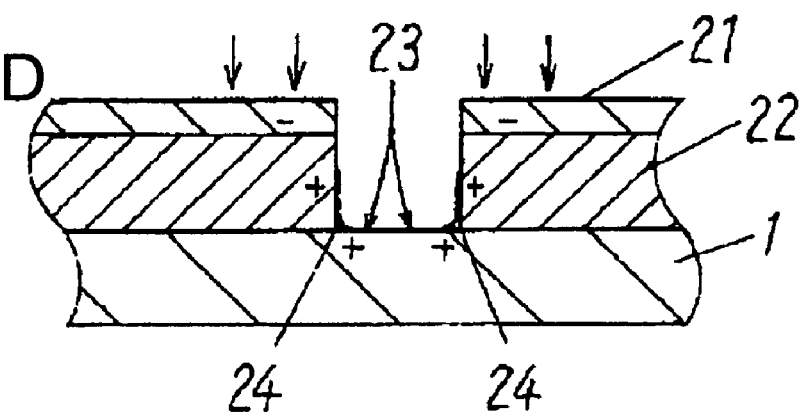
FIG. 2D is a sectional view of the device at a line 2D—2D in FIG. 2C.

During the etching of metal film 22, the electrode is having the curved shape in section in the following manner. FIGS. 2A to 2D are conceptual views illustrating shapes of the electrodes at the etching. FIGS. 2A and 2B illustrate a conventional SAW device having no cut portion between electrodes adjacent to each other.

When dry etching is performed for forming the pattern shown in FIG. 2A, resist 21 is charged in negative since ion beam 23 consists of ion charged positively. The metal film 22 and piezoelectric substrate 1 is charged positively. Thus, ion beam 23 flows in straight at an initial stage of the etching, and accordingly etches metal film 22 substantially in accordance with the shape of resist 21. However, as the etching proceeds, the amount of charges on metal film 22 and the amount of charges on piezoelectric substrate 1 gradually increase.

Since piezoelectric substrate 1, metallic film 22, and ion beam 23 are charged positively, the positive charges of metallic film 22 and piezoelectric substrate 1 repel ion beam 23. The charges prevents ion beam 23 from flowing in straight, thus forcing ion beam 23 to curve halfway and strike a side of metal film 22, which results in side etching. Accordingly, atoms are ejected from the side of metal film 22 by ion beam 23, and some of those atoms re-adhere on edges of metal film 22 and piezoelectric substrate 1. Such a phenomenon continuing causes components of metal film 22 to accumulate on the sides of metal film 22 and the piezoelectric substrate, thus making the electrode have the apparently-curved shape in section. As the dry etching further proceeds, a portion of resist 21 is ejected by ion beam 23 and is carbonized to adhere on the surface of the curved portion 24 in section of the electrode.

Under the situation for the electrode, energy of a propagating surface acoustic wave leaks out from curved portion 24 in section of the electrode. Accordingly, the propagation loss increases, and in extreme cases, the electrodes adjacent to each other are short-circuited, thus deteriorating a property of the SAW device considerably.

To prevent the phenomenon, according to the present embodiment, each common portion 5 of reflector electrode 3 has the portion cut off linearly at a corner facing interdigital electrode 2, and each reflector electrode 3 has the portions cut off linearly at its outermost strip portion adjacent to interdigital electrode 2. The space between interdigital electrode 2 and reflector electrode 3 thus increases partially.

Such shape described above allows the space between interdigital electrode 2 and reflector electrode 3 to be larger than a space between electrodes of the conventional SAW device, thus reducing f the influence of electrical charge on metal film 22 and reducing a curvature of ion beam 23. Consequently, the side etching can be avoided, so that the common portion and the strip portion are prevented from having the curved shapes in section.

In particular, the increase of the space between respective corners of the common portions of the electrodes prevents the common portions from being short-circuited with each other. The increase of the space between strip portion 10 of reflector electrode 3 and interdigitating portion 9 of interdigital electrode 2 reduces leakage of the energy of the propagating surface acoustic wave, thereby reducing the propagation loss.

A region between interdigital electrode 2 and reflector electrodes 3 is small, while a large region which is contiguous to the small region and has no electrode is provided. When the etching is performed for forming the small region and the large region simultaneously, the ion beam is mostly used to etch a region that becomes the large region, and a region that becomes the small region is provided with the ion beam reaching it. Thus, the small region is not etched sufficiently for becoming the small region, particularly in an area where the small and large regions are contiguous to each other.

Since the area which is not etched sufficiently extends from the common portion to a portion of the strip portion, just the increase of the space between the respective common portions of the electrodes prevents the short-circuit between the electrodes, but cannot prevent the leakage of the energy of the propagating surface acoustic wave.

To prevent the leakage, the space between the strip portion and the interdigital electrode is increased. This facilitates the supply of the ion beam to the region that becomes the small region in etching, so that the etching is performed well and thus leaves no region lacking etching. The leakage of the energy of the propagating surface acoustic wave can thus be reduced for smaller propagation loss.

Even if, for example, metal film 22 and piezoelectric substrate 1 have the same amount of charges, the increase of the space between the electrodes adjacent to each other, that is, interdigital electrode 2 and reflector electrode 3 reduces a relative interactions between the respective electric charges on metal films 22. This reduces the curvature of ion beam 23, thus preventing the electrode from having curved portion 24 in section.

The dry etching provides metal film 22 and piezoelectric substrate 1 with the electrical charge not small as a whole. The direction of ion beam 23 is affected not only by the amount of the charges itself but also by a partial unbalance of the amount of respective charges. In other words, amounts of respective charges on interdigitating portions 9 of interdigital electrode 2 facing each other are relatively balanced because of a small difference between the amounts of respective charges on the interdigitating portions 9. A difference between the amount of charges on common portion 4 and the amount of charges on interdigitating portion 9 is often generated because common portion 4 and interdigitating portion 9 have areas different from each other.

Similarly to above for reflector electrode 3, a difference between the amount of charges on strip portion 10 and the amount of charges on common portion 5 of reflector electrode 3 is often generated. Since the electric charges are all positive similarly to the charge carried by the ion beam, the unbalance between the amounts of charges causes the beam to be strongly repelled by the portion having the larger amount of charges. The ion beam is thus forced to curve in a direction opposite to the portion, thus proceeding the side etching. Consequently, the electrode has a noticeably curved shape in section.

The difference between the amount of charges on common portion 4 of interdigital electrode 2 and the amount of charges on common portion 5 of reflector electrode 3 is often generated, thus causing the electrode to have a curved shape in section. Even in cases that the space between the electrodes are the same, the electrode often has the curved shape in section between the respective common portions of the electrodes, thereby causing the short circuit between the electrodes.

For the above reason, a part of the common portions adjacent to each other is cut off to provide the space between the electrodes. The increase of the space between the electrodes reduces the influence of the unbalance between the amounts of charges, and reduces the curvature of the ion beam. Thus, the beam flows in straight, so that the electrode can be inhibited from having the curved shape in section.

Common portion 4 of interdigital electrode 2 has the larger amount of charges than common portion 5 of reflector electrode 3 since having a larger area, and thus, portion 4 often has the curved shape in section.

Common portion 4 of interdigital electrode 2, common portion 5 of reflector electrode 3, or both of them may be cut to obtain the same effects. In particular, the cutting of common portion 4 of interdigital electrode 2 may change a center frequency, and thus, the cutting of common portion 5 of reflector electrode 3 influences the property of the SAW device less than the cutting of common portion 4 of interdigital electrode 2.

According to the present embodiment illustrated by FIG. 1A, four common portions 5 of reflector electrodes 3 have the cut portions facing interdigital electrode 2. However, the SAW device may have one or more cut portions to reduce the propagation loss.

The propagation loss is reduced most by cutting all of the corners of the common portions adjacent to each other.

An electronic unit including SAW device 12 will be described.

Figure 3:
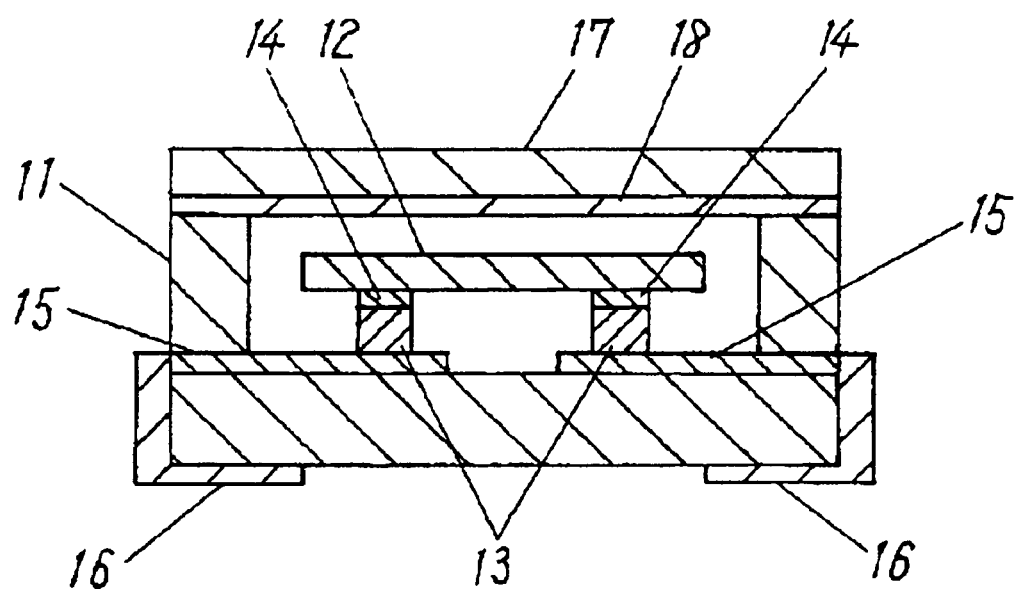
FIG. 3 is a sectional view of an electronic unit in accordance with embodiment 1.

FIG. 3 is a sectional view of the electronic unit including SAW device 12. The electronic unit includes base 11, SAW device 12, bumps 13, pad electrodes 14 of SAW device 12, lead electrodes 15, terminal electrodes 16, cover 17, and adhesive 18.

Pad electrodes 14 located on SAW device 12 are provided with bumps 13 made of gold or the like attached on the electrodes 14. SAW device 12 having bumps 13 is then placed facedown towards base 11 previously provided with lead electrodes 15 and terminal electrodes 16, and bumps 13 contact lead electrodes 15, respectively. Bumps 13 are coupled to base 11 by, for example, ultrasonic wave. Base 11 having SAW device 12 is provided with cover 17 having adhesive 18, such as solder, while adhesive 18 faces base 11, and then, is heated to be sealed with cover 17 by sealing equipment, thus providing the electronic unit.

SAW device 12 may be mounted by another method, such as wiring bonding, according to requirement. Adhesive 18 may be made of gold, brazing filler metal including gold, or plating including gold.

While the electrodes of the SAW device are formed by the charged ions or charged particles in dry etching, the electrodes is susceptible to the side etching due to the charges. However, the increase of the space between the electrodes adjacent to each other reduces the amount of charges per unit length, and thus reduces the curvature of ion beam 23, thereby reducing the side etching of the electrodes. This reduces the propagation loss of the SAW device.

The thicker the electrode, the larger the region which undergoes the side etching. Thus, the electrode is susceptible to the side etching due to the charges of the charged ions or particles. However, the increase of the space between the electrodes adjacent to each other reduces the amount of charges per unit length, and thus reduces the curvature of ion beam 23, thereby reducing the side etching of the electrodes. This reduces the propagation loss of the SAW device.

According to the present embodiment, the thickness of the electrode is 220 nm, and the cut portion of the electrodes satisfies the following conditions:

$H1/H0=1.7;$ $D1/D0=0.75;$ and $D2/d0=1.5.$

The thicker the electrode, the larger ratios H1/H0 and D1/D0 need to be. The electrode having a thickness less than 150 nm is less susceptible to the side etching.

Even in cases that the electrodes have the same thickness, the narrower the space between the electrodes, the more the beam is affected by the electrical charge of the charged electrodes, thus often causing the side etching of the electrode, and increasing the propagation loss. For this reason, the space between the electrodes should be determined according to the thickness of the electrodes. According to the present embodiment, the electrode has a 220 nm thickness, and ratio S/L of the space S between the electrodes to the thickness L of the electrode is 2.7. The larger ratio S/L reduces the side etching more, thus reducing the propagation loss. For the electrode having a 150 nm or more thickness, ratio S/L of 2.5 or more reduces the side etching, thus reducing the propagation loss. Ratio S/L less than 2.5 often generates the side etching, thus increasing the propagation loss.

As described above, the conditions for the cut portion of the electrodes adjacent to each other and the space between the electrodes should be determined according to the thickness of the electrodes.

Moreover, the electrodes made of material less susceptible to etching is etched less even when the electrodes are attacked by the charged ions or the charged particles. The increasing of the space between the electrodes adjacent to each other prevents the electrode from being affected by the side etching. Thus, the SAW device has a reduced propagation loss.

In the dry etching, metal film 22 is etched by the electrically-charged ion beam irradiated thereto including the ions striking metal film 22. The metal film 22 having a larger mass requires larger energy for ejecting the atoms from metal film 22. For this reason, the metal film 22 may be made of atoms having a larger mass for resisting the side etching due to the irradiated ion beam.

An electrode of a SAW device is typically made of Al, and thus, the electrode of the SAW device of the embodiment may be made of metal, such as Ti, which has larger mass than Al, for reducing the side etching of the electrode. However, the electrode made of only such material having large mass provides the SAW device with a center frequency limited within a low frequency. Thus, the combination of the materials having a small mass and the large mass in stacked relation is effective for both adjusting the center frequency and resisting the side etching.

The conditions for the cut portion were as follows:

$H1/H0=1.7$;

$D1/D0=0.75$; and $D2/d0=1.5$.

The larger the ratio $H1/H0$ and/or $D1/D0$ (i.e. the greater the space between the electrodes adjacent to each other), the more the electrode is prevented from having the curved shape in section, and thus, the propagation loss of the SAW device can be reduced. However, the increase of the space between the electrodes was effective under the following condition:

$H1/H0 \geq 1.2$; and/or $1/4 \leq D1/D0 \leq 1$ and $1/2 \leq D2/d0 \leq 6$.

In the case that common portion 5 of reflector electrode 3 is cut, the propagation loss of the SAW device can be reduced even for a large value of the ratio H1/H0, for example, $H1/H0=10$.

In the case that the ratio H1/H0 is not larger than 1.2, that the ratio D1/D0 is smaller than 1/4, or that the ration D2/d0 is smaller than 1/2, the propagation loss was not reduced remarkably.

If the ratio D2/d0 is larger than 6, the cut portion extends to a main region for propagating the surface acoustic wave, and thus, the propagation of the surface acoustic wave becomes imbalance. As a result, the propagation loss increases.

When only one of the ratios H1/H0, D1/D0, and D2/d0 is an extremely large value, the propagation loss reduces less. Thus, the ratios H1/H0, D1/D0, and D2/d0 have to be all balanced.

Cutting of strip portion 10 of reflector electrode 3 in particular prevents the energy of the propagating surface acoustic wave from leaking from the main propagation region, thus, reducing the propagation loss of the SAW device.

While metal film 22 is dry-etched to form the pattern of the electrodes, the wafer, which is to be divided into piezoelectric substrates 1, can hardly irradiated with ion beam 23 entirely under the same condition because of a problem associated with equipment. In other words, ion beam 23 is applied to a central portion of the wafer in a direction substantially perpendicular to the wafer, while ion beam 23 is applied to an outer portion of the wafer at an angle different from the direction perpendicular to the wafer from the beginning of the etching.

For the above reason, the electrode in the outer portion of the wafer is irradiated diagonally with incident ion beam 23, thus often accepting the side etching, and a temperature rise of the wafer accelerates the etching. Therefore, the electrode tends to easily have the curved shape in section.

To prevent this phenomenon, the space between the electrodes adjacent to each other of the SAW device that are located in the outer portion of the wafer is determined to be larger than the space between the electrodes located in the central portion of the wafer. This arrangement reduces the curvature of ion beam 23 and hence reduce the side etching of the electrode in the outer portion of the wafer even when that electrode is irradiated diagonally with incident ion beam 23 since the amount of charges per unit length is reduced.

According to the present embodiment, the electrode adjacent is cut linearly. The similar advantages can be obtained even if the electrode is cut to form a step or to cut in curve or stepwise. The electrode may be cut into any shape other than those described above as long as the electrode is partially cut off.

According to embodiment 1 described above, common portion 5 and strip portion 10 of reflector electrode 3 are partially cut off to increase the space between the common portion and the interdigital electrode and the space between the strip portion and the interdigital electrode. The increase of the spaces reduces the influence of the amount of charges on the electrodes adjacent to each other and reduces the influence of the unbalance between the amounts of charges during forming the pattern of the electrodes by etching of the metal film, thereby preventing the electrodes from having the curved shape in section. Consequently, the SAW device has a reduced propagation loss.

Exemplary Embodiment 2

Figure 4:
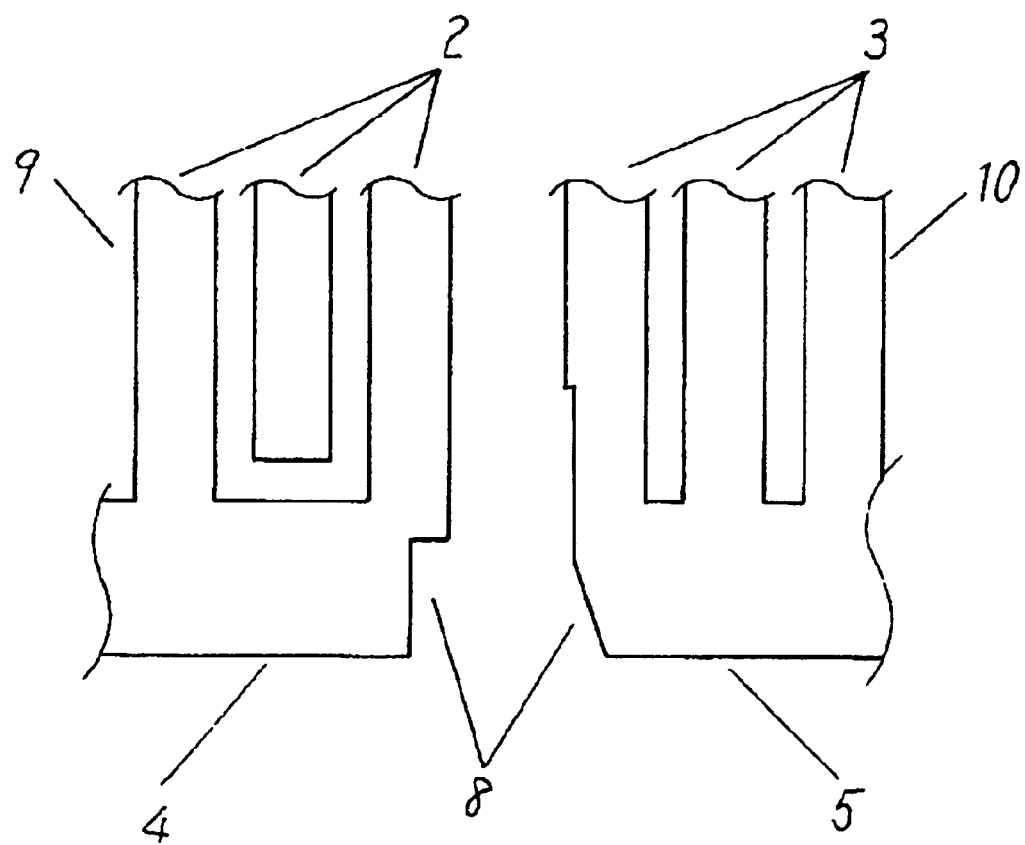
FIG. 4 is an enlarged partial view of a SAW device in accordance with exemplary embodiment 2 of the invention.

FIG. 4 is an enlarged partial view of a surface acoustic wave (SAW) device in accordance with exemplary embodiment 2 of the present invention.

In FIG. 4, elements similar to those in FIG. 1B illustrating the device of embodiment 1 are denoted by the same reference numerals and is not described in detail. FIG. 4 schematically illustrates a pattern of electrodes but not illustrating a relative dimensional relation between the electrodes.

The SAW device according to embodiment 2 is similar to that of embodiment 1 except that electrodes adjacent to each other of SAW device of embodiment 2 are cut at portions in shape and location from those of embodiment 1.

According to embodiment 2, common portion 5 and strip portion 10 of reflector electrode 3 are partially cut off linearly, and common portion 4 of interdigital electrode 2 is partially cut off to form a step. According to this arrangement, a space between common portions 4 and 5 of electrodes 2, 3 adjacent to each other increases more than a space obtained by cutting only one of the electrodes. Since the amount of charges per unit length can be reduced, the curvature of ion beam 23 and the influence of an unbalance between the amounts of charges are reduced, and thus side etching of the electrode reduces. Consequently, the electrodes are prevented from having a curved shape in section, thus allowing the SAW device to have reduced propagation loss.

According to embodiment 2, common portion 5 of reflector electrode 3 is partially cut off linearly, and strip portion 10 is partially cut off to form a step. The similar advantages can be obtained even if the common portion 5 and strip portion 10 are partially cut off in curve or stepwise. Common portion 5 and strip portion 10 may be cut into any shapes other than those described above as long as common portion 5 and strip portion 10 are partially cut off.

According to embodiment 2 described above, common portion 5 and strip portion 10 of reflector electrode 3 are partially cut off linearly. Additionally, common portion 4 of interdigital electrode 2 is partially cut off to form the step, so that the space between the electrodes adjacent to each other increases more. The increase of the space between the electrodes reduces the influence of the amount of charges and the influence of the unbalance between the amounts of charges, thus preventing the electrode more from having the curved shape in section. Consequently, the SAW device has a reduced propagation loss.

Exemplary Embodiment 3

Figure 5:
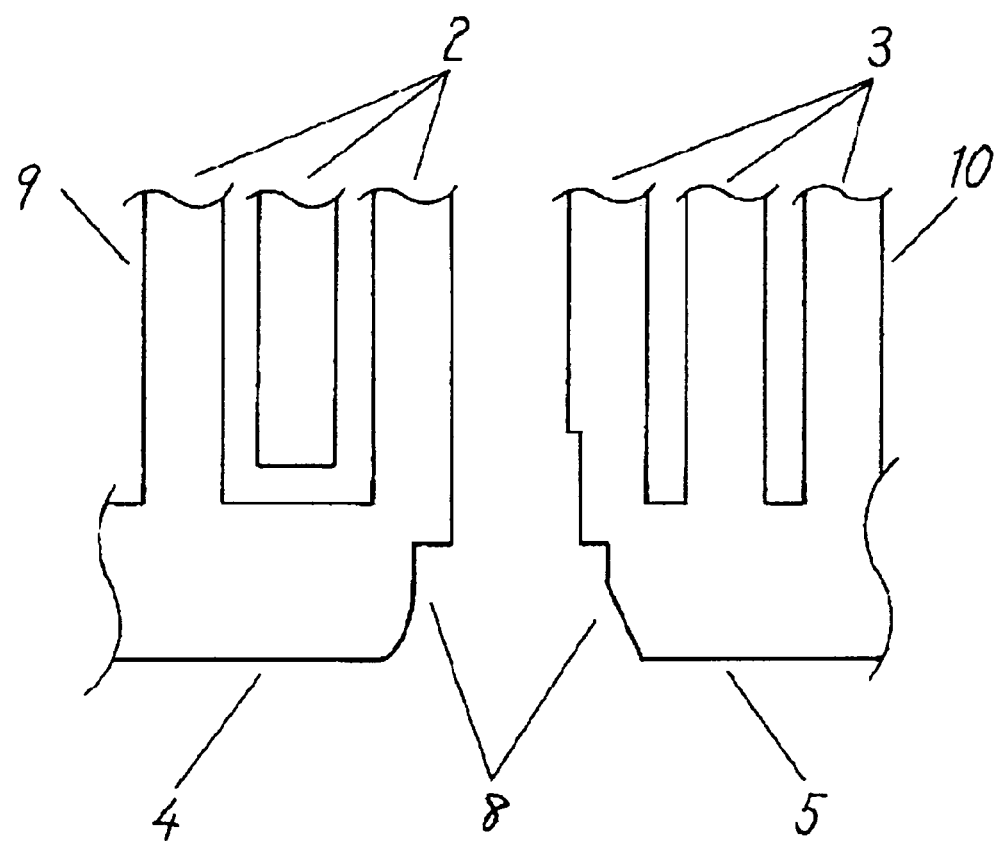
FIG. 5 is an enlarged partial view of a SAW device in accordance with exemplary embodiment 3 of the invention.
Figure 6A:
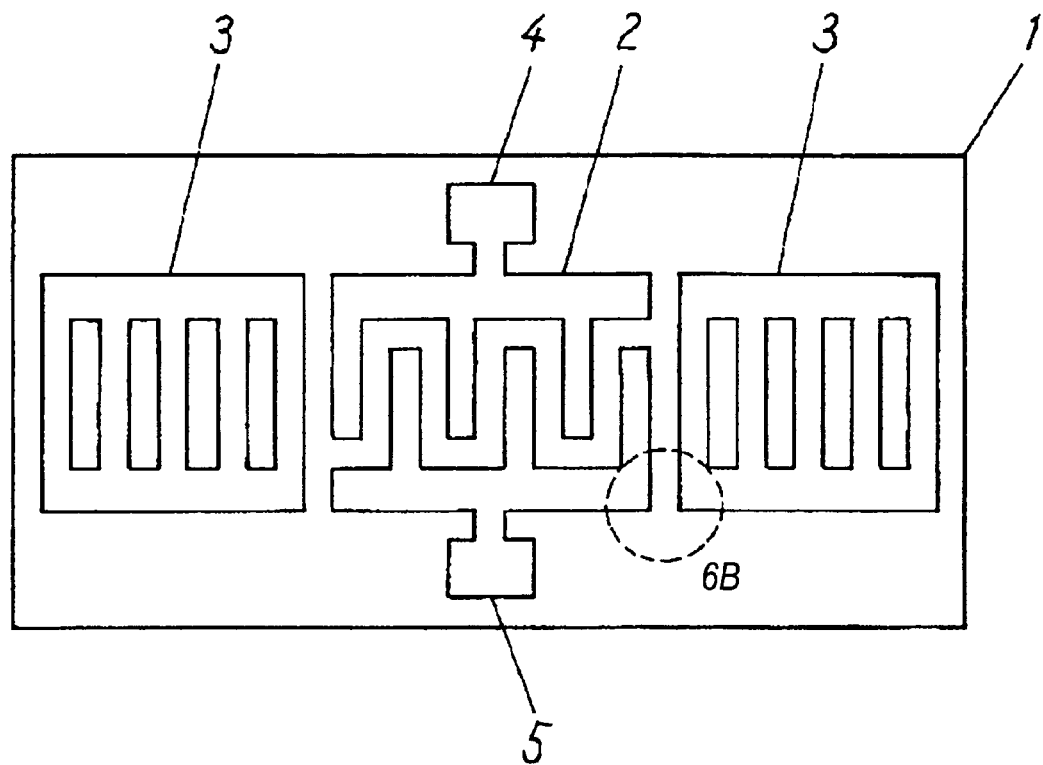
FIG. 6A is a plan view of the conventional SAW device.
Figure 6B:
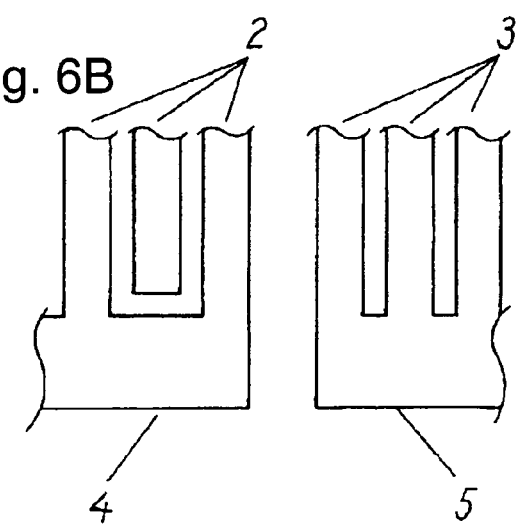
FIG. 6B is an enlarged partial view of the conventional SAW device.

FIG. 5 is an enlarged partial view of a surface acoustic wave (SAW) device in accordance with exemplary embodiment 3 of the present invention. In FIG. 5, elements similar to those shown in FIG. 1B illustrating embodiment 1 are denoted by the same reference numerals and are not described in detail. FIG. 5 schematically illustrates a pattern of electrodes, and does not illustrating a relative dimensional relation between the electrodes.

The SAW device of embodiment 3 is similar to that of embodiment 1 except that the electrodes adjacent to each other of the SAW device of this embodiment are cut at portions different in shape and location from those of embodiment 1. According to embodiment 3, common portion 5 is partially cut off to form a step and linearly, and strip portion 10 is partially cut off linearly. Moreover, common portion 4 of interdigital electrode 2 is partially cut off to form a step and in curved, thus employing a combination of plural cut shapes.

Thus, a space between respective common portions 4 and 5 of interdigital electrode 2 and reflector electrode 3 increases more than electrodes obtained by cutting only one of the electrodes. Further, the electrodes can be cut into various shapes formed by combining plural cut shapes, for example, even if the space is tight for the layout of the pattern of the electrode from a design viewpoint. For such layout of the pattern, the amount of charges per unit length can be reduced. Accordingly, the curvature of ion beam 23 and the influence of an unbalance between the amounts of charges are reduced, thus side etching of the electrode is reduced. As a result, the electrodes are prevented from having a curved shape in section, thus allowing the SAW device to have reduced propagation loss.

According to embodiment 3, one of the common portions is partially cut off to form the step and partially cut off linearly, and the other common portion is partially cut off to form the step and in curve. The similar advantages can be obtained even if the electrode is cut to form a combination of plural shapes including a step, a linear shape, a curved shape and a stepwise shape. The electrodes may be cut into any shape other than the shapes described above as long as the electrodes adjacent to each other are partially cut off.

According to embodiment 3 described above, common portion 5 of reflector electrode 3 is partially cut off to form the step and partially cut off linearly, strip portion 10 is partially cut off linearly, and common portion 4 of interdigital electrode 2 is partially cut off to form the step and partially cut off in curve. The combination of the plural cut shapes increases the space between the electrodes adjacent to each other even in the case that the space is tight for the layout of the pattern of the electrodes from the design viewpoint, thus reducing the influence of the amount of charges and the influence of the unbalance between the amounts of charges. Therefore, the space between the electrodes can be increased even in the case that the space is tight for the layout of the pattern of the electrode from the design viewpoint, the electrodes of any pattern can be prevented from having the curved shape insection. Consequently, the SAW device can have the reduced propagation loss.

INDUSTRIAL APPLICABILITY

According to the present invention, a common portion and a strip portion of a reflector electrode that are adjacent to an interdigital electrode are partially cut off to increase a space between the electrodes. The increase of the space between the electrodes reduces the influence of the amount of charges on the electrodes and the influence of an unbalance between the amounts of charges during forming a pattern of the electrodes by etching of a metal film, thereby preventing the electrodes from having a curved shape in section. Consequently, a surface acoustic wave device has a reduced propagation loss.

| Reference Numerals | |
| --- | --- |
| 1 | Piezoelectric Substrate |
| 2 | Interdigital Electrode |
| 3 | Reflector Electrode |
| 4 | Common Portion of Interdigital Electrode |
| 5 | Common Portion of Reflector Electrode |
| 6 | Input Terminal Electrode |
| 7 | Output Terminal Electrode |
| 8 | Cut Portion |
| 9 | Interdigitating Portion |
| 10 | Strip Portion |
| 11 | Base |
| 12 | Surface Acoustic Wave Device |
| 13 | Bump |
| 14 | Pad Electrode |
| 15 | Lead Electrode |
| 16 | Terminal Electrode |
| 17 | Cover |
| 18 | Adhesive |
| 21 | Resist |
| 22 | Metal Film |
| 23 | Ion Beam |
| 24 | Curved Portion in Section of Electrode |

The invention claimed is:

1. A surface acoustic wave device comprising:
   a piezoelectric substrate;
   an interdigital electrode provided on said piezoelectric substrate; and
   a reflector electrode provided on said piezoelectric substrate, said reflector electrode including a common portion and a strip portion,
   wherein said common portion and said strip portion of said reflector electrode have respective cut portions adjacent to said interdigital electrode formed therein.

2. The surface acoustic wave device of claim 1, wherein said common portion and said strip portion of said reflector electrode having said cut portions have potentials generated therein different from a potential generated in said interdigital electrode adjacent to said common portion and said strip portion.

3. The surface acoustic wave device of claim 1, wherein said interdigital electrode and said reflector electrode have all corners adjacent to each other cut off.

4. The surface acoustic wave device of claim 1,
   wherein said piezoelectric substrate is split from a piezoelectric substrate wafer, and
   wherein an amount of said cut portion in a central portion of said piezoelectric substrate wafer is smaller than an amount of said cut portion in an outer portion of said wafer.

5. The surface acoustic wave device of claim 1, wherein said interdigital electrode and said reflector electrode are formed by dry etching.

6. The surface acoustic wave device of claim 1, wherein said interdigital electrode and said reflector electrode include material less susceptible to etching than Al.

7. The surface acoustic wave device of claim 6, wherein said material less susceptible to etching than Al has larger mass than Al.

8. The surface acoustic wave device of claim 1, wherein said interdigital electrode and said reflector electrode have thicknesses of 150 nm or more.

9. The surface acoustic wave device of claim 1, wherein a ratio (S/L) of a space (S) between said interdigital electrode and said reflector electrodes to a thickness (L) of each of said electrodes is 2.5 or more.

10. The surface acoustic wave device of claim 1,
    wherein a cut width of said cut portion of said common portion in a longitudinal direction of said strip portion of said reflector electrode is ¼ to 1 times of a width of said common portion of said reflector electrode, and
    wherein a cut width in a longitudinal direction of said cut portion of said strip portion is ½ to 6 times of a width of said strip portion.

11. The surface acoustic wave device of claim 1, wherein said interdigital electrode includes a common portion having a cut portion formed partially therein.

12. The surface acoustic wave device of claim 11, wherein a cut width of said cut portion of said common portion of said interdigital electrode in one of a width direction and a longitudinal direction of said strip portion is ¼ to 1 times of a width of said common portion of said interdigital electrode.

13. The surface acoustic wave device of claim 1, wherein a maximum space between said cut portion of said strip portion and said interdigital electrode in a direction of a width of said strip portion is 1.2 or more times of a space between a portion of said strip portion other than said cut portion of said strip portion and said interdigital electrode.

14. The surface acoustic wave device of claim 1, wherein said cut portion is formed in a step shape.

15. The surface acoustic wave device of claim 1, wherein said cut portion is cut linearly.

16. The surface acoustic wave device of claim 1, wherein said cut portion is formed in curve.

17. The surface acoustic wave device of claim 1, wherein said cut portion is formed stepwise.

18. The surface acoustic wave device of claim 1, wherein said cut portion is shaped into a combination of at least two of a step, a linear shape, a curved shape and a stepwise shape.

19. A unit comprising:
    a base;
    a surface acoustic wave device disposed on said base, said surface acoustic wave device including
    a piezoelectric substrate,
    an interdigital electrode provided on said piezoelectric substrate, and
    a reflector electrode provided on said piezoelectric substrate, said reflector electrode including a common portion and a strip portion, said common portion and said strip portion having respective cut portions adjacent to said interdigital electrode;
    one of a bump and a wire for electrically coupling said base to said surface acoustic wave device; and
    a cover for sealing said surface acoustic wave device.

20. A method of manufacturing a surface acoustic wave device, comprising the steps of:
    forming a plurality of interdigital electrodes on a piezoelectric substrate wafer;
    forming a plurality of reflector electrodes on the piezoelectric substrate wafer, the plurality of reflector electrodes each including a common portion and a strip portion having respective cut portions formed therein adjacent to the interdigital electrode; and
    dividing the piezoelectric substrate wafer to obtain a plurality of surface acoustic wave devices each including at least one of the plurality of interdigital electrodes and at least one of the plurality of reflector electrodes, wherein an amount of the cut portion of a surface acoustic wave device of the plurality of surface acoustic wave devices that is located at a central portion of the piezoelectric substrate wafer is smaller than a surface acoustic wave device of the plurality of surface acoustic wave devices that is located in an outer portion of the wafer.

21. The method of claim 20,
    wherein said step of forming the plurality of interdigital electrodes includes the sub-step of forming the plurality of interdigital electrodes by dry etching, and
    wherein said step of forming the plurality of reflector electrodes includes the sub-step of forming the plurality of reflector electrodes by dry etching.

* * * * *